(12) United States Patent
Lemmer et al.

(10) Patent No.: US 7,462,398 B2
(45) Date of Patent: Dec. 9, 2008

(54) COATED ARTICLE WITH ZINC OXIDE OVER IR REFLECTING LAYER AND CORRESPONDING METHOD

(75) Inventors: Jean-Marc Lemmer, Luxembourg (LU); Pierre Pallotta, Villerupt (FR); Jose Ferreira, Luxembourg (LU)

(73) Assignee: Centre Luxembourgeois de Recherches pour le Verre et la Ceramique S.A. (C.R.V.C.), Grand Duche de Luxembourg (LU)

( * ) Notice: Subject to any disclaimer, the term of this patent is extended or adjusted under 35 U.S.C. 154(b) by 0 days.

(21) Appl. No.: 10/787,823

(22) Filed: Feb. 27, 2004

(65) Prior Publication Data

US 2005/0191501 A1    Sep. 1, 2005

(51) Int. Cl.
*B32B 9/00* (2006.01)

(52) U.S. Cl. ............... 428/426; 428/428; 428/432; 428/434

(58) Field of Classification Search ............ 428/34, 428/426, 428, 432, 446, 448, 697, 698, 701, 428/702, 704
See application file for complete search history.

(56) References Cited

U.S. PATENT DOCUMENTS

| | | | |
|---|---|---|---|
| 3,978,273 A | 8/1976 | Groth | |
| 4,806,220 A | 2/1989 | Finley | |
| 5,153,054 A | 10/1992 | Depauw et al. | |
| 5,201,926 A | 4/1993 | Szczyrbowski et al. | |
| 5,344,718 A | 9/1994 | Hartig et al. | |
| 5,552,180 A | 9/1996 | Finley et al. | |
| 5,557,462 A | 9/1996 | Hartig et al. | |
| 5,584,902 A | 12/1996 | Hartig et al. | |
| 5,688,585 A | 11/1997 | Lingle et al. | |
| 5,718,980 A | 2/1998 | Koch et al. | |
| 5,770,321 A | 6/1998 | Hartig et al. | |
| 5,800,933 A | 9/1998 | Hartig et al. | |
| 5,821,001 A | 10/1998 | Arbab et al. | |
| 5,837,361 A * | 11/1998 | Glaser et al. | ............... 428/216 |
| 5,935,702 A | 8/1999 | Macquart et al. | |
| 5,948,538 A | 9/1999 | Brochot et al. | |

(Continued)

FOREIGN PATENT DOCUMENTS

DE    42 11 363    10/1993

(Continued)

OTHER PUBLICATIONS

Physical Properties of Zinc Oxide Films Prepared by dc Reavtive Magnetron Sputtering at Different Sputtering Pressures, Subramanyam et al, Cryst. Res. Technol., 35 (2000) 10, pp. 1193-1202.*

(Continued)

*Primary Examiner*—Timothy M Speer
(74) *Attorney, Agent, or Firm*—Nixon & Vanderhye P.C.

(57) ABSTRACT

A coated article is provided that may be heat treated in certain example embodiments. A coating of the coated article includes a zinc oxide inclusive layer located over and contacting a contact layer that is in contact with an infrared (IR) reflecting layer of a material such as silver. It has been found that the use of such a zinc oxide inclusive layer results in improved thermal stability upon heat treatment, more neutral and/or desirable coloration, lower sheet resistance ($R_s$), and/or lower emissivity.

15 Claims, 2 Drawing Sheets

U.S. PATENT DOCUMENTS

| | | | |
|---|---|---|---|
| 6,042,934 | A | 3/2000 | Guiselin et al. |
| 6,090,481 | A | 7/2000 | Depauw et al. |
| 6,287,675 | B1 | 9/2001 | Guiselin et al. |
| 6,316,110 | B1 | 11/2001 | Anzaki et al. |
| 6,322,881 | B1 | 11/2001 | Boire et al. |
| 6,336,999 | B1 | 1/2002 | Lemmer et al. |
| 6,340,529 | B1 | 1/2002 | Ebisawa et al. |
| 6,398,925 | B1 | 6/2002 | Arbab et al. |
| 6,445,503 | B1 | 9/2002 | Lingle |
| 6,514,620 | B1 | 2/2003 | Lingle et al. |
| 6,524,688 | B1 | 2/2003 | Eby et al. |
| 6,524,714 | B1 | 2/2003 | Neuman et al. |
| 6,541,084 | B2 | 4/2003 | Wang |
| 6,576,349 | B2 | 6/2003 | Lingle et al. |
| 6,582,809 | B2 | 6/2003 | Boire et al. |
| 6,589,658 | B1 | 7/2003 | Stachowiak |
| 6,602,608 | B2 | 8/2003 | Stachowiak |
| 6,605,358 | B1 | 8/2003 | Stachowiak |
| 6,625,875 | B2 | 9/2003 | Sol |
| 6,632,491 | B1 | 10/2003 | Thomsen et al. |
| 6,686,050 | B2 | 2/2004 | Lingle et al. |
| 2002/0064662 | A1 | 5/2002 | Lingle et al. |
| 2003/0049464 | A1 | 3/2003 | Glenn et al. |
| 2003/0150711 | A1 | 8/2003 | Laird |
| 2003/0165693 | A1* | 9/2003 | Hartig et al. ................ 428/426 |
| 2003/0194570 | A1 | 10/2003 | Lingle et al. |
| 2004/0005467 | A1 | 1/2004 | Neuman et al. |
| 2004/0043226 | A1 | 3/2004 | Laird et al. |

FOREIGN PATENT DOCUMENTS

| | | |
|---|---|---|
| EP | 0 500 445 | 8/1992 |
| EP | 0 567 735 | 11/1993 |
| EP | 1 174 397 | 1/2002 |
| EP | 1 238 950 | 9/2002 |
| EP | 1 329 307 | 7/2003 |
| FR | WO 02/48065 * | 6/2002 |

OTHER PUBLICATIONS

U.S. Appl. No. 11/393,727, filed Mar. 31, 2006.

* cited by examiner

COATED ARTICLE WITH ZINC OXIDE OVER IR REFLECTING LAYER AND CORRESPONDING METHOD

This invention relates to a coated article including a layer comprising zinc oxide over an infrared (IR) reflecting layer. In certain example embodiments, the coated article may be heat treated (e.g., thermally tempered, heat bent and/or heat strengthened).

BACKGROUND OF THE INVENTION

Coated articles are known in the art for use in window application such as insulating glass (IG) window units, vehicle windows, monolithic windows, and/or the like. It is known that in certain instances, it is desirable to heat treat (e.g., thermally tempered, heat bent and/or heat strengthened) such coated articles for purposes of tempering, bending, or the like.

In certain example instances, designers of coated articles often strive for a combination of high visible transmission, substantially neutral color, low emissivity (or emittance), and low sheet resistance ($R_s$). High visible transmission and substantially neutral color may permit coated articles to be used in applications where these characteristics are desired such as in architectural or vehicle window applications, whereas low-emissivity (low-E) and low sheet resistance characteristics permit such coated articles to block significant amounts of IR radiation so as to reduce for example undesirable heating of vehicle or building interiors. In certain example instances, low U-values are also desired.

However, heat treatment of coated articles typically requires use of temperature(s) of at least 580 degrees C., more preferably of at least about 600 degrees C. and still more preferably of at least 620 degrees C. The use of such high temperatures (e.g., for 5-10 minutes or more) often causes coatings to break down and/or causes one or more of the aforesaid desirable characteristics to significantly deteriorate in an undesirable manner. For example, thermal tempering of certain coated articles may cause color and/or visible transmission to shift to an undesirable value that may be aesthetically and/or functionally displeasing.

In view of the above, it will be apparent to those skilled in the art that there exists a need for coated articles which are capable of providing high visible transmission, substantially neutral color, low emissivity (or emittance), and/or low sheet resistance ($R_s$). In certain example embodiments, it may be desired that one or all of these characteristics can be achieved even after the coated article has been heat treated.

BRIEF SUMMARY OF EXAMPLE EMBODIMENTS OF THE INVENTION

In certain example embodiments of this invention, a layer comprising zinc oxide is provided over a contact layer that is in contact with an IR reflecting layer of a material such as silver. Surprisingly, it has been found that the use of such a zinc oxide inclusive layer results in improved thermal stability upon heat treatment, more neutral and/or desirable coloration, lower sheet resistance ($R_s$), and/or lower emissivity.

In certain example embodiments of this invention, there is provided a coated article comprising the following layers from the glass substrate outwardly: glass/$TiO_x$/$Si_xN_y$/ZnO/Ag/$NiCrO_x$/ZnO/$Si_xN_y$. Other layers may be provided in certain instances, and it is possible that other materials may be used for certain layers. Surprisingly, it has been found that the provision of the zinc oxide inclusive layer directly over and contacting the nickel chrome oxide inclusive layer above the silver IR reflecting layer provides for unexpected results. In particular, by using zinc oxide in this layer (as opposed to solely tin oxide for example), the resulting coated article upon heat treatment (HT) unexpectedly has, for example, one or more of: improved thermal stability, more neutral or desirable coloration, lower sheet resistance ($R_s$), and lower emissivity (e.g., hemispherical emissivity). These surprisingly results associated with the use of the combination layer stack portion of glass . . . ZnO/Ag/$NiCrO_x$/ZnO . . . are highly advantageous, since lower emissivity, lower sheet resistance, desirable coloration and/or thermal stability are desired features in coated articles.

In certain example embodiments of this invention, this layer stack portion may be used in the context of a single silver layer stack, although this invention is not so limited.

In certain example embodiments, there is provided a coated article comprising a coating supported by a glass substrate, the coating comprising: a dielectric layer; a first layer comprising zinc oxide located over the dielectric layer; an infrared (IR) reflecting layer comprising silver located over and contacting the first layer comprising zinc oxide; a layer comprising an oxide of NiCr located over and contacting the IR reflecting layer; a second layer comprising zinc oxide located over and contacting the layer comprising the oxide of NiCr; and another dielectric layer located over the second layer comprising zinc oxide.

In other example embodiments, there is provided a coated article comprising a coating supported by a glass substrate, the coating comprising: a first layer comprising zinc oxide located over the dielectric layer; an infrared (IR) reflecting layer located over and contacting the first layer comprising zinc oxide; a layer comprising an oxide of Ni and/or Cr located over and contacting the IR reflecting layer; a second layer comprising zinc oxide located over and contacting the layer comprising the oxide of Ni and/or Cr; and another dielectric layer located over the second layer comprising zinc oxide.

In certain other example embodiments, there is provided a insulating glass (IG) window unit including a heat treated coated article comprising a coating supported by a glass substrate, the coating comprising: at least one dielectric layer; only one infrared (IR) reflecting layer comprising silver located over the at least one dielectric layer; a layer comprising an oxide of Ni and/or Cr located over and contacting the IR reflecting layer; a layer comprising zinc oxide located over and contacting the layer comprising the oxide of Ni and/or Cr; another dielectric layer located over the second layer comprising zinc oxide; and wherein the IG unit has a visible transmission of at least 70% and a U-value of no greater than 1.25 W/($m^2$K).

DETAILED DESCRIPTION OF EXAMPLES OF THE INVENTION

Coated articles herein may be used in applications such as monolithic windows, IG window units, vehicle windows, and/or any other suitable application that includes single or multiple glass substrates.

In certain example embodiments of this invention, there is provided a coated article comprising the following layers from the glass substrate outwardly: glass/TiO$_x$/Si$_x$N$_y$/ZnO/Ag/NiCrO$_x$/ZnO/Si$_x$N$_y$. Other layers and/or other materials may also be utilized in certain example embodiments of this invention. For example, while the aforesaid coating is a single silver stack, this invention is not so limited.

Surprisingly, it has been found that the provision of the zinc oxide inclusive layer directly over the nickel chrome oxide inclusive layer above the silver infrared (IR) reflecting layer provides for unexpected results. In particular, by using zinc oxide in this layer (as opposed to solely tin oxide for example), the resulting coated article when heat treated unexpectedly has, for example: improved thermal stability, more neutral and/or desirable coloration, lower sheet resistance ($R_s$), and lower emissivity (e.g., hemispherical emissivity). These surprisingly results associated with the use of the combination layer stack portion of glass . . . . ZnO/Ag/NiCrO$_x$/ZnO . . . are highly advantageous and represent a significant improvement in the art, since lower emissivity, lower sheet resistance, desirable coloration and/or thermal stability are desired features in coated articles.

The terms "heat treatment" and "heat treating" as used herein mean heating the article to a temperature sufficient to achieve thermal tempering, bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes.

Figure 1:
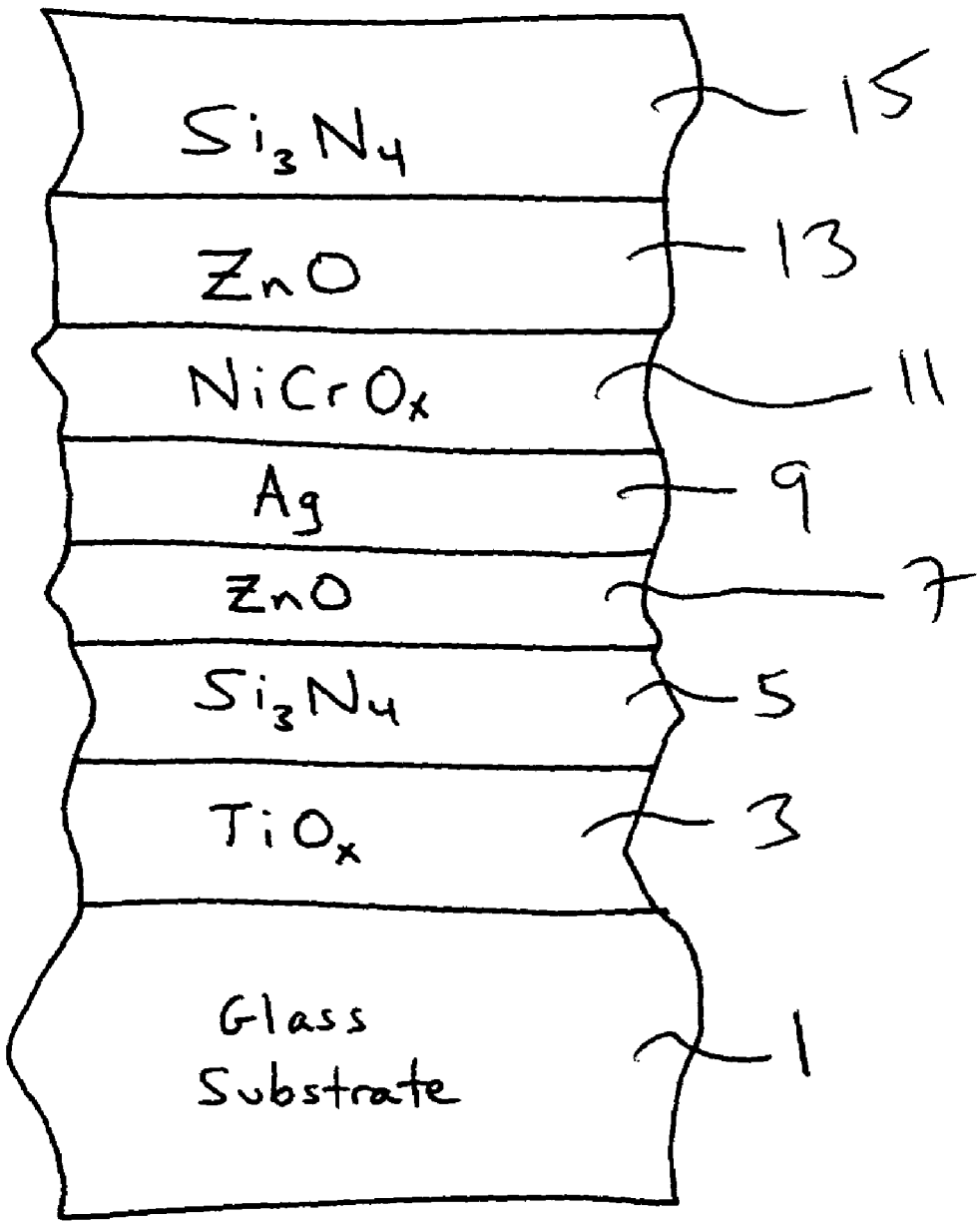
FIG. 1 is a cross sectional view of a coated article according to an example embodiment of this invention.

FIG. 1 is a cross sectional view of a coated article (heat treated, or non-heat treated) according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate either directly or indirectly. As shown in FIG. 1, the coating comprises dielectric layer 3, dielectric layer 5, zinc oxide inclusive layer 7, IR reflecting layer 9 including or of silver, gold, or the like, upper contact layer 11 of or including an oxide of nickel chrome (e.g., NiCrO$_x$), zinc oxide inclusive layer 13, and dielectric layer 15 of or including a material such as silicon nitride which may in certain example instances be a protective overcoat. Other layers and/or materials may also be provided in certain example embodiments of this invention, and it is also possible that certain layers may be removed or split in certain example instances.

In monolithic instances, the coated article includes only one glass substrate 1 as illustrated in FIG. 1. However, monolithic coated articles herein may be used in devices such as IG window units for example. Typically, an IG window unit may include two spaced apart substrates. Example IG window units are illustrated and described, for example, in U.S. Pat. Nos. 5,770,321, 5,800,933, 6,524,714, 6,541,084 and U.S. 2003/0150711, the disclosures of which are all hereby incorporated herein by reference. An example IG window unit may include, for example, the coated glass substrate 1 shown in FIG. 1 coupled to another glass substrate via spacer(s), sealant(s) or the like with a gap being defined therebetween. This gap between the substrates in IG unit embodiments may in certain instances be filled with a gas such as argon (Ar). An example IG unit may comprise a pair of spaced apart clear glass substrates each about 4 mm thick one of which is coated with a coating herein in certain example instances, where the gap between the substrates may be from about 5 to 30 mm, more preferably from about 10 to 20 mm, and most preferably about 16 mm. In certain example instances, the coating may be provided on the side of the inner glass substrate 1 facing the gap.

In certain example IG unit embodiments of this invention, the coating is designed such that the resulting IG unit (e.g., with, for reference purposes, a pair of 4 mm clear glass substrates spaced apart by 16 mm with Ar gas in the gap) has a U-value of no greater than 1.25 W/(m$^2$K), more preferably no greater than 1.20 W/(m$^2$K), even more preferably no greater than 1.15 W/(m$^2$K), and most preferably no greater than 1.10 W/(m$^2$K).

The bottom dielectric layer 3 may be of or include titanium oxide in certain example embodiments of this invention. The titanium oxide of layer 3 may in certain example instances be represented by TiO$_x$, where x is from 1.5 to 2.5, most preferably about 2.0. The titanium oxide may be deposited via sputtering or the like in different embodiments. In certain example instances, dielectric layer 3 may have an index of refraction (n), at 550 nm, of at least 2.0, more preferably of at least 2.1, and possibly from about 2.3 to 2.6 when the layer is of titanium oxide. In certain embodiments of this invention, the thickness of titanium oxide inclusive layer 3 is controlled so as to allow a* and/or b* color values (e.g., transmissive, film side reflective, and/or glass side reflective) to be fairly neutral (i.e., close to zero) and/or desirable. Other materials may be used in addition to or instead of titanium oxide in certain example instances.

Dielectric layer 5 may be of or include silicon nitride in certain embodiments of this invention. Silicon nitride layer 5 may be provided in order to improve adhesion between titanium oxide layer 3 and zinc oxide layer 7. Moreover, silicon nitride layer 5 may, among other things, improve heat-treatability of the coated articles, e.g., such as thermal tempering or the like. The silicon nitride of layer 5 may be of the stoichiometric type (Si$_3$N$_4$) type, or alternatively of the Si-rich type in different embodiments of this invention. For example, Si-rich silicon nitride combined with zinc oxide inclusive layer 7 under a silver layer 9 may permit the silver to be deposited (e.g., via sputtering or the like) in a manner which causes its sheet resistance to be lessened compared to if certain other material(s) were under the silver. Moreover, the presence of free Si in a Si-rich silicon nitride inclusive layer 5 may allow certain atoms such as sodium (Na) which migrate outwardly from the glass 1 during HT to be more efficiently stopped by the Si-rich silicon nitride inclusive layer before they can reach the silver and damage the same. Thus, it is believed that the oxidation caused by heat treatment allows visible transmission to increase, and that the Si-rich Si$_x$N$_y$ in layer 5 can reduce the amount of damage done to the silver layer(s) during HT in certain example embodiments of this invention thereby allowing sheet resistance ($R_s$) to decrease in a satisfactory manner.

In certain example embodiments, when Si-rich silicon nitride us used in layer 5, the Si-rich silicon nitride layer 5 may be characterized by Si$_x$N$_y$ layer(s), where x/y may be from 0.76 to 1.5, more preferably from 0.8 to 1.4, still more preferably from 0.85 to 1.2. Moreover, in certain example embodiments, before and/or after HT the Si-rich Si$_x$N$_y$ layer(s) may have an index of refraction "n" of at least 2.05, more preferably of at least 2.07, and sometimes at least 2.10 (e.g., 632 nm) (note: stoichiometric $Si_3N_4$ which may also be used has an index "n" of 2.04). Also, the Si-rich $Si_xN_y$ layer in certain example embodiments may have an extinction coefficient "k" of at least 0.001, more preferably of at least 0.003 (note: stoichiometric $Si_3N_4$ has an extinction coefficient "k" of effectively 0).

The silicon nitride layer 5 may be doped with other materials such as stainless steel or aluminum in certain example embodiments of this invention. For example, the silicon nitride layer 5 may include from about 0-15% aluminum, more preferably from about 1 lo 10% aluminum, in certain example embodiments of this invention. The silicon nitride may be deposited by sputtering a target of Si or SiAl in certain embodiments of this invention.

Infrared (IR) reflecting layer 9 is preferably substantially or entirely metallic and/or conductive, and may comprise or consist essentially of silver (Ag), gold, or any other suitable IR reflecting material. IR reflecting layer 9 help allow the coating to have low-E and/or good solar control characteristics. The IR reflecting layer may, however, be slightly oxidized in certain embodiments of this invention.

The upper contact layer 11 may be of or include nickel (Ni) oxide, chromium/chrome (Cr) oxide, or a nickel alloy oxide such as nickel chrome oxide ($NiCrO_x$), or other suitable material(s), in certain example embodiments of this invention. The use of, for example, $NiCrO_x$ in this layer allows durability to be improved. The $NiCrO_x$ layer 11 may be fully oxidized in certain embodiments of this invention (i.e., fully stoichiometric), or alternatively may only be partially oxidized. In certain instances, the $NiCrO_x$ layer 11 may be at least about 50% oxidized. Contact layer 11 (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layer 11 (e.g., of or including an oxide of Ni and/or Cr) may or may not be continuous in different embodiments of this invention across the entire IR reflecting layer.

Layer 13 and lower contact layer 7 in certain embodiments of this invention are of or include zinc oxide (e.g., ZnO). The zinc oxide of layer(s) 7 and/or 13 may contain other materials as well such as Al (e.g., to form $ZnAlO_x$). For example, in certain example embodiments of this invention, one or both of zinc oxide layers 7 and 13 may be doped with from about 1 to 10% Al, more preferably from about 1 to 5% Al, and most preferably about 2 to 4% Al. The use of zinc oxide under the silver 9 allows for an excellent quality of silver to be achieved.

Surprisingly, it has been found that the provision of zinc oxide inclusive layer 13 directly over the nickel chrome oxide contact layer 11 above the silver infrared (IR) reflecting layer 9 provides for unexpected results. In particular, by using zinc oxide in this layer 13 (as opposed to solely tin oxide for example), the resulting coated article when heat treated unexpectedly has, for example: improved thermal stability, more neutral and/or desirable coloration, lower sheet resistance ($R_s$), and lower emissivity (e.g., hemispherical emissivity). These surprisingly results associated with the use of the combination layer stack portion of glass . . . $ZnO/Ag/NiCrO_x/ZnO$ . . . are highly advantageous and represent a significant improvement in the art, since lower emissivity, lower sheet resistance, desirable coloration and/or thermal stability are desired features in coated articles. Thus, in certain example embodiments of this invention, coated articles may be taken to higher temperatures during heat treatment without suffering undesirable color shifts, significant transmission drops, and/or increases in sheet resistance (this is advantageous in view of the fact that many different types of furnaces may be used to heat treat coated articles, and different furnaces typically have different characteristics such as temperature). Additionally, it has also been found that by using zinc oxide in this layer 13 (as opposed to solely tin oxide for example), the resulting coated article is unexpectedly more durable with respect to temperature/humidity testing.

While the reasons for these unexpected results associated with the use of zinc oxide in layer 13 are not entirely clear, it is believed that the use of the zinc oxide in layer 13 for some reason causes the silver of IR reflecting layer 9 to be more dense and have a more preferred orientation before and/or after heat treatment (HT). It is very surprising that this is the case, especially since a contact layer 11 (e.g., $NiCrO_x$) is provided between the zinc oxide layer 13 and the silver layer 9. Because the zinc oxide in layer 13 causes the silver in layer 9 to be more dense and/or have a more preferred orientation, the silver in layer 9, the silver and thus the overall coating is better able to withstand heat treatment at high temperatures so that a heat treated coated article with lower sheet resistance and emissivity is obtainable. Moreover, because the zinc oxide in layer 13 causes the silver in layer 9 to be more dense and/or have a more preferred orientation, it is believed that color shifting during heat treatment can be controlled in a desirable manner.

Dielectric layer 15, which may be an overcoat in certain example instances, may be of or include silicon nitride (e.g., $Si_3N_4$) or any other suitable material in certain example embodiments of this invention. Optionally, other layers may be provided above layer 15. Layer 15 is provided for durability purposes, and to protect the underlying layers during heat treatment and/or environmental use. In certain example embodiments, layer 15 may have an index of refraction (n) of from about 1.9 to 2.2, more preferably from about 1.95 to 2.05.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses may be used in different embodiments of this invention, example thicknesses and materials for the respective layers on the glass substrate 1 in the FIG. 1 embodiment are as follows, from the glass substrate outwardly:

TABLE 1

(Example Materials/Thicknesses; FIG. 1 Embodiment)

| Layer | Preferred Range (Å) | More Preferred (Å) | Example (Å) |
|---|---|---|---|
| $TiO_x$ (layer 3) | 30-400 Å | 100-150 Å | 128 Å |
| $Si_xN_y$ (layer 5) | 40-300 Å | 60-100 Å | 79 Å |
| $ZnO_x$ (layer 7) | 10-300 Å | 60-100 Å | 67 Å |
| Ag (layer 9) | 50-250 Å | 80-150 Å | 120 Å |
| $NiCrO_x$ (layer 11) | 10-80 Å | 20-70 Å | 45 Å |
| ZnO (layer 13) | 40-400 Å | 100-150 Å | 129 Å |
| $Si_3N_4$ (layer 15) | 50-750 Å | 250-350 Å | 294 Å |

In certain example embodiments of this invention, coated articles herein may have the following low-E (low emissivity) and/or solar characteristics set forth in Table 2 when measured monolithically (before any possible HT).

TABLE 2

Low-E/Solar Characteristics (Monolithic; pre-HT)

| Characteristic | General | More Preferred | Most Preferred |
|---|---|---|---|
| $R_s$ (ohms/sq.): | <=10.0 | <=6.5 | <=6.0 |
| $E_h$: | <=0.14 | <=0.10 | <=0.08 |
| $T_{vis}$ (%): | >=70 | >=78 | >=83 |

In certain example embodiments, coated articles herein may have the following characteristics, measured monolithically for example, after HT:

TABLE 3

Low-E/Solar Characteristics (Monolithic; post-HT)

| Characteristic | General | More Preferred | Most Preferred |
|---|---|---|---|
| $R_s$ (ohms/sq.): | <=8.0 | <=5.0 | <=4.3 |
| $E_h$: | <=0.11 | <=0.07 | <=0.05 |
| $T_{vis}$ (%): | >=70 | >=78 | >=85 |

Moreover, coated articles including coatings according to certain example embodiments of this invention have the following optical characteristics (e.g., when the coating(s) is provided on a clear soda lime silica glass substrate 1 from 1 to 10 mm thick) (HT or non-HT). In Table 4, all parameters are measured monolithically, unless stated to the contrary such as with U-value which is measured post-HT and, for purposes of reference only and without limitation, in the context of an IG window unit with a pair of 4 mm thick clear glass substrates spaced 16 mm apart via a gap filled with Ar gas. In Table 4 below, $R_fY$ is visible reflection from the side of the monolithic article on which coating is located (i.e., "f" means film side of monolithic article). As explained above, it is noted that U-value is measured in the context of an IG Unit, as is $T_{vis}$-IG (not monolithic like the rest of the data in Table 4). Likewise, Δa* and Δb* are measures of how much a* and b*, respectively, change due to heat treatment.

TABLE 4

Example Optical Characteristics (before and/or after HT)

| Characteristic | General | More Preferred |
|---|---|---|
| $T_{vis}$ (or TY)(Ill. C, 2 deg.): | >=70% | >=80% |
| $a^*_t$ (Ill. C, 2°): | -2.5 to +1.0 | -1.75 to 0.0 |
| $b^*_t$ (Ill. C, 2°): | -1.0 to +4.0 | 0.0 to 2.0 |

TABLE 4-continued

Example Optical Characteristics (before and/or after HT)

| Characteristic | General | More Preferred |
|---|---|---|
| $\Delta a^*_t$: | <=1.0 | <=0.7 |
| $\Delta b^*_t$: | <=1.0 | <=0.5 |
| $R_fY$ (Ill. C, 2 deg.): | 1 to 7% | 1 to 6% |
| $a^*_f$ (Ill. C, 2°): | -5.0 to +2.0 | -1.5 to +0.5 |
| $b^*_f$ (Ill. C, 2°): | -14.0 to +10.0 | -10.0 to 0 |
| $T_{vis}$-IG: | >=70% | >=78% |
| U-value (IG)(W/(m²K)): | <=1.25 | <=1.15 (or <=1.10) |

The value(s) Δa* and Δb* above, in view of their rather low values, illustrate thermal stability of these transmissive color values due to HT.

EXAMPLE 1

The following examples are provided for purposes of example only, and are not intended to be limiting. The following Example 1 was made via sputtering so as to have approximately the layer stack set forth below, from the clear glass substrate outwardly. The listed thicknesses are approximations:

TABLE 5

Layer Stack for Example 1

| Layer | Thickness |
|---|---|
| Glass Substrate | about 4 mm |
| $TiO_x$ | 100-150 Å |
| $Si_3N_4$ | 60-100 Å |
| $ZnAlO_x$ | 60-100 Å |
| Ag | 100-140 Å |
| $NiCrO_x$ | 30-45 Å |
| $ZnAlO_x$ | 100-150 Å |
| $Si_3N_4$ | 250-350 Å |

The process used in forming the coated article of Example 1 is set forth below. Below, the gas flows (argon (Ar), oxygen (O), and nitrogen (N)) are in units of sccm, and include both tuning gas and gas introduced through the main. The linespeed was about 4.2 m/min. The pressures are in units of mbar×10⁻³. The cathodes used for sputtering the silver and nickel chrome oxide layers included planar targets (double planar for the silver), and the others dual C-Mag targets. The silicon (Si) targets, and thus the silicon nitride layers, were doped with about 10% aluminum (Al), so as to be indicated by SiAl targets. The Zn targets in a similar manner were also doped with Al, so as to be indicated by ZnAl targets. Power is in units of kW, and Volts in V. Under volts, two values indicate that there were two targets in the chamber and the two values are the voltage values for the two targets, respectively.

TABLE 6

Sputter Processing Used in Example 1

| Cathode | Target | Power | Volts | Ar | O | N | Pressure |
|---|---|---|---|---|---|---|---|
| C66 | TiO | 31.5 | 347/323 | 350 | 48 | 0 | 1.82 |
| C65 | TiO | 31.5 | 351/351 | 350 | 48 | 0 | 2.20 |
| C64 | TiO | 31.5 | 395/387 | 350 | 48 | 0 | 1.78 |
| C59 | SiAl | 40 | 241 | 350 | 0 | 434 | 2.06 |
| C53 | ZnAl | 22 | 220 | 350 | 260 | 0 | 2.13 |
| C49 | Ag | 3.6 | 453/428 | 500 | 10 | 0 | 1.96 |
| C48 | NiCr | 16 | 558 | 250 | 152 | 0 | 1.41 |

TABLE 6-continued

Sputter Processing Used in Example 1

| Cathode | Target | Power | Volts | Ar | O | N | Pressure |
|---|---|---|---|---|---|---|---|
| C46 | ZnAl | 43 | 235 | 350 | 455 | 0 | 2.03 |
| C43 | SiAl | 49 | 258 | 350 | 0 | 398 | 2.55 |
| C37 | SiAl | 49 | 264 | 350 | 0 | 398 | 2.17 |
| C36 | SiAl | 49 | 261 | 350 | 0 | 398 | 1.84 |

After being sputter deposited onto the glass substrate, Example 1 had the following characteristics before being subjected to heat treatment, measured monolithically and in the center of the coated article:

TABLE 7

Characteristics of Example 1 (Monolithic - pre-HT)

| Characteristic | Example 1 |
|---|---|
| Visible Trans. ($T_{vis}$ or TY)(Ill. C 2 deg.): | 84.67% |
| a* | −0.83 |
| b* | 1.42 |
| Glass Side Reflectance (RY)(Ill C, 2 deg.): | 7.38% |
| a* | −4.20 |
| b* | −6.92 |
| Film Side Reflective (FY)(Ill. C, 2 deg.): | 5.14 |
| a* | −4.06 |
| b* | −6.43 |
| $R_s$ (ohms/square) (pre-HT): | 5.7 |

After being heat treated at about 625 degrees C. for about 10 minutes, the coated article of Example 1 had the following characteristics, measured monolithically and in the center of the coated article:

TABLE 8

Characteristics of Example 1 (Monolithic - post-HT)

| Characteristic | Example 1 |
|---|---|
| Visible Trans. ($T_{vis}$ or TY)(Ill. C 2 deg.): | 87.57% |
| a* | −1.47 |
| b* | 1.04 |
| Glass Side Reflectance (RY)(Ill C, 2 deg.): | 6.52% |
| a* | −0.49 |
| b* | −8.89 |
| Film Side Reflective (FY)(Ill. C, 2 deg.): | 5.07 |
| a* | −0.40 |
| b* | −9.35 |
| $R_s$ (ohms/square) (post-HT): | 4.17 |

It can be seen from Example 1 above that following heat treatment the coated article was characterized by substantially neutral transmissive a* and b* color values. This is highly advantageous, as these color values are typically viewed as aesthetically pleasing to those in the art. Thermal stability is evidenced by the fact that transmissive Δa* and Δb* values were fairly low and important transmissive and film side reflective color values (a*, b*) were desirable following heat treatment.

EXAMPLES 2-3 and COMPARATIVE EXAMPLE

Examples 2-3 were made as follows, for the purpose of comparison to a Comparative Example (CE) which used tin oxide instead of zinc oxide for layer 13. Examples 2-3, line Example 1, had the layer stack illustrated in FIG. 1, and were made as follows via sputtering.

TABLE 9

Sputter Processing Used in Example 2

| Cathode | Target | Power | Volts | Ar | O | N | Pressure |
|---|---|---|---|---|---|---|---|
| C66 | TiO | 33 | 355/341 | 350 | 42 | 0 | 1.85 |
| C65 | TiO | 33 | 346/343 | 350 | 42 | 0 | 2.01 |
| C59 | SiAl | 43 | 248 | 350 | 0 | 437 | 2.24 |
| C53 | ZnAl | 21.5 | 220 | 350 | 255 | 0 | 2.05 |
| C49 | Ag | 4 | 374/366 | 500 | 10 | 0 | 1.45 |
| C48 | NiCr | 16 | 563 | 250 | 181 | 0 | 1.35 |
| C46 | ZnAl | 42.5 | 237 | 350 | 455 | 0 | 2.07 |
| C37 | SiAl | 87 | 327 | 350 | 0 | 598 | 2.51 |
| C36 | SiAl | 87 | 327 | 350 | 0 | 598 | 1.96 |

TABLE 10

Sputter Processing Used in Example 3

| Cathode | Target | Power | Volts | Ar | O | N | Pressure |
|---|---|---|---|---|---|---|---|
| C66 | TiO | 33 | 355/341 | 350 | 42 | 0 | 1.85 |
| C65 | TiO | 33 | 346/343 | 350 | 42 | 0 | 2.01 |
| C59 | SiAl | 43 | 248 | 350 | 0 | 437 | 2.24 |
| C53 | ZnAl | 21.5 | 220 | 350 | 255 | 0 | 2.05 |
| C49 | Ag | 4 | 374/366 | 500 | 10 | 0 | 1.45 |
| C48 | NiCr | 11.6 | 527.6 | 250 | 110 | 0 | 1.36 |
| C46 | ZnAl | 42.5 | 237 | 350 | 455 | 0 | 2.07 |
| C37 | SiAl | 87 | 327 | 350 | 0 | 598 | 2.51 |
| C36 | SiAl | 87 | 327 | 350 | 0 | 598 | 1.96 |

It is noted that Examples 2 and 3 were made in the same way, except for the $NiCrO_x$ layer 11. In particular, $NiCrO_x$ layer 11 in Example 2 was sputtered using significantly more oxygen than that of Example 3 as can be seen above. Thus, the $NiCrO_x$ layer 11 in Example 2 was more oxidized than that of Example 3.

A Comparative Example (CE) was also made. The Comparative Example (CE) was made in the same way as Example 2, except that in the CE cathode C46 from Example 2 was replaced with a Sn (tin) target. In other words, in the CE, ZnO layer 13 of Example 2 was replaced with a tin oxide ($SnO_2$) layer for purposes of comparison. The tin oxide layer in the CE was formed by sputtering a Sn target using a power of 27 kW, 247 V, 250 sccm Ar, 480 sccm oxygen, and 100 sccm nitrogen gas, at a pressure of 1.57.

After being sputter deposited onto respective glass substrates, Examples 2 and 3, and the Comparative Example (CE) with tin oxide were heat treated at about 625 degrees C. for about 10 minutes. Following heat treatment, the coated articles of Examples 2-3 and the CE had the following characteristics, measured monolithically and in the center of the coated article:

TABLE 11

Characteristics of Examples 2-3 and Comp. Example (Monolithic - post-HT)

| Characteristic | Example 2 | Example 3 | CE |
|---|---|---|---|
| Visible Trans. ($T_{vis}$ or TY) (Ill. C 2 deg.): | 87.82% | 87.86% | 83.74% |
| a* | −1.21 | −1.51 | −2.26 |
| b* | 1.62 | 1.19 | −0.41 |
| Glass Side Reflectance (RY) (Ill C, 2 deg.): | 7.09% | 6.20% | 6.56% |
| a* | −1.39 | −0.21 | −1.01 |
| b* | −9.14 | −8.98 | −8.53 |

TABLE 11-continued

Characteristics of Examples 2-3 and Comp. Example
(Monolithic - post-HT)

| Characteristic | Example 2 | Example 3 | CE |
|---|---|---|---|
| Film Side Reflective (FY) (Ill. C, 2 deg.): | 5.48 | 4.92% | 4.50% |
| a* | −1.42 | −0.01 | 0.16 |
| b* | −9.50 | −9.25 | −10.98 |
| $R_s$ (ohms/square) (post-HT): | 4.11 | 4.05 | 4.5 |

It can be seen from the above, that Examples 2-3 (with zinc oxide layer 13) had surprisingly better characteristics than the Comparative Example (CE) which replaced the zinc oxide of layer 13 with tin oxide. In particular, Examples 2-3, compared to the CE, had (a) lower sheet resistance ($R_s$), (b) higher visible transmission, (c) better transmissive a* values (i.e., closer to zero), and (d) better film side reflective a* values (i.e., slightly negative values are sometimes desired because they are less red than are positive values). Thus, it can be seen that the use of the zinc oxide in layer 13 (compared to the tin oxide of the CE) unexpectedly results in improved sheet resistance, improved visible transmission, and improved coloration as shown by the Examples above.

Figure 2:
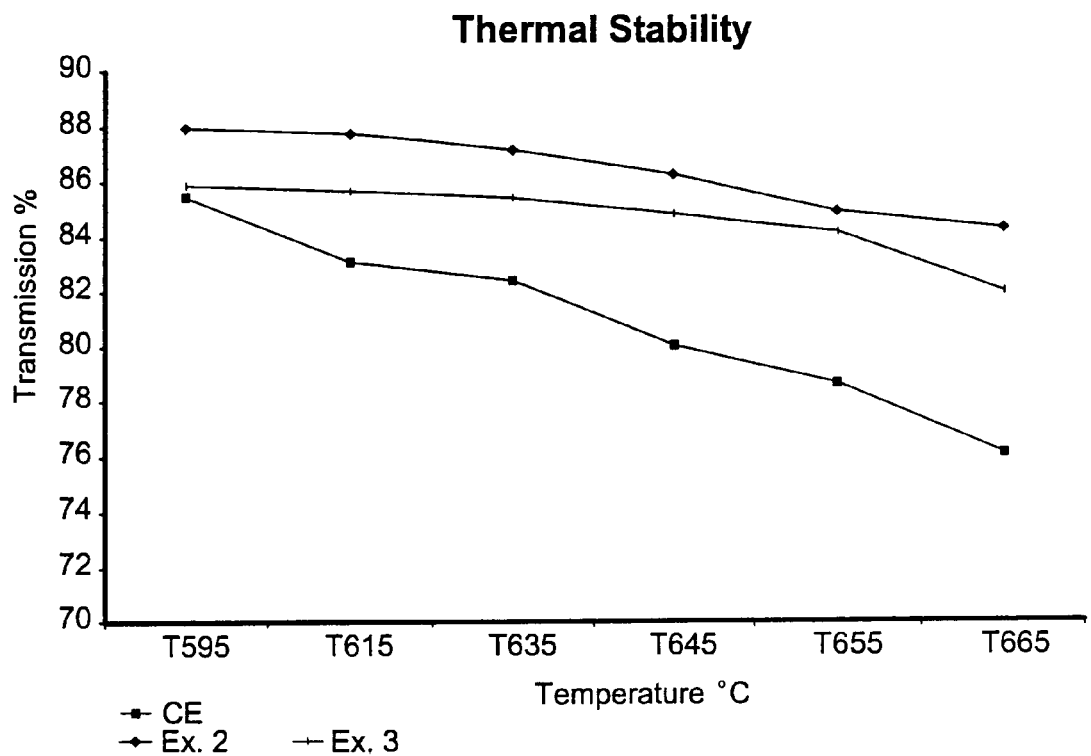
FIG. 2 is a visible transmission versus heat treatment temperature graph illustrating thermal stability of certain examples of this invention.
Figure 3:
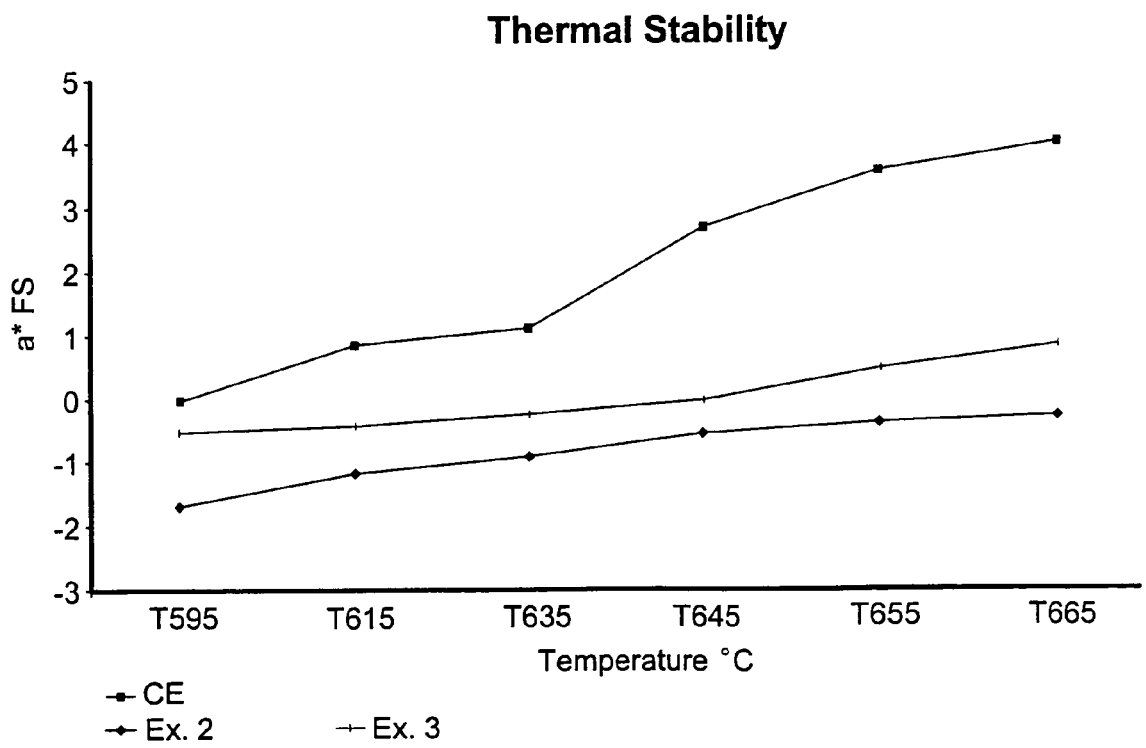
FIG. 3 is a film side a* color versus heat treatment temperature graph illustrating thermal stability of certain examples of this invention.

FIGS. 2-3 are graphs illustrating the improved thermal stability of Examples 2-3 compared to the Comparative Example (CE); these graphs illustrating heat treatment at different temperatures. FIG. 2 illustrates that the CE which used tin oxide for layer 13 experienced a significant transmission drop due to HT at certain high temperatures, whereas Examples 2-3 which replaced this layer with zinc oxide did not. FIG. 3 illustrates that the CE which used tin oxide for layer 13 experienced a significant film side a* color shift to rather high positive values due to HT at certain high temperatures, whereas Examples 2-3 which replaced this layer with zinc oxide did not. The unexpected advantages resulting from the use of zinc oxide as at least part of layer 13 are clear.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article comprising a coating supported by a glass substrate, the coating comprising:
   a dielectric layer comprising titanium oxide having a refractive index of at least 2.0 on and directly contacting the glass substrate;
   a layer comprising silicon nitride provided over and contacting the dielectric layer;
   a first layer comprising zinc oxide located over and contacting the layer comprising silicon nitride;
   an infrared (IR) reflecting layer comprising silver located over and contacting the first layer comprising zinc oxide;
   a layer comprising an oxide of NiCr located over and contacting the IR reflecting layer;
   a second layer comprising zinc oxide located over and contacting the layer comprising the oxide of NiCr;
   another dielectric layer comprising silicon nitride located over the second layer comprising zinc oxide; and
   wherein a dielectric layer stack between the glass substrate and the IR reflecting layer consists essentially of (a) said dielectric layer comprising titanium oxide having the refractive index of at least 2.0 which contacts the glass substrate, (b) said layer comprising silicon nitride, and (c) said layer comprising zinc oxide which contacts the IR reflecting layer, so that said dielectric layer comprising titanium oxide contacts said layer comprising silicon nitride in said layer stack between the glass substrate and the IR reflecting layer.

2. The coated article of claim 1, wherein at least one of the first and second layers comprising zinc oxide further comprises aluminum.

3. The coated article of claim 1, wherein the coated article is heat treated.

4. The coated article of claim 1, wherein the silicon nitride in the layer comprising silicon nitride located between the substrate and the first layer comprising zinc oxide is Si-rich so as to be represented by $Si_xN_y$, where x/y is from 0.76 to 1.5.

5. The coated article of claim 1, wherein the silicon nitride in the layer comprising silicon nitride located between the substrate and the first layer comprising zinc oxide is Si-rich so as to be represented by $Si_xN_y$, where x/y is from 0.8 to 1.4.

6. The coated article of claim 1, wherein the silicon nitride in the layer comprising silicon nitride located between the substrate and the first layer comprising zinc oxide comprises $Si_3N_4$.

7. The coated article of claim 1, wherein the coating includes only one IR reflecting layer comprising silver.

8. The coated article of claim 1, wherein the coated article is heat treated, and following heat treatment the coated article measured monolithically is characterized by the following:

| | |
|---|---|
| transmissive a*: | −1.75 to 0 |
| transmissive b*: | 0 to 2.0 |
| $R_s$ (ohms/square): | <=5.0. |

9. The coated article of claim 1, wherein the coated article is heat treated, and following heat treatment the coated article measured monolithically is characterized by the following:

| | |
|---|---|
| visible transmission: | >=85% |
| transmissive a*: | −1.75 to 0 |
| $R_s$ (ohms/square): | <=4.3. |

10. The coated article of claim 1, wherein the glass substrate and the coating are part of an IG window unit, wherein the IG window unit has a U-value of no greater than 1.25 W/(m²K).

11. The coated article of claim 1, wherein the glass substrate and the coating are part of an IG window unit, wherein the IG window unit has a U-value of no greater than 1.15 W/(m²K).

12. The coated article of claim 1, wherein the coated article is heat treated and has a Δa* value (transmissive) of no greater than 1.0 due to heat treatment.

13. The coated article of claim 1, wherein the coated article is heat treated and has a Δa* value (transmissive) of no greater than 0.7 due to heat treatment.

14. A coated article comprising a coating supported by a glass substrate, the coating comprising:
   a dielectric layer comprising titanium oxide having a refractive index of at least 2.0 on and directly contacting the glass substrate;
   a layer comprising silicon nitride provided over the dielectric layer;

a first layer comprising zinc oxide located over the layer comprising silicon nitride;
an infrared (IR) reflecting layer comprising silver located over and contacting the first layer comprising zinc oxide;
a layer comprising an oxide of NiCr located over and contacting the IR reflecting layer;
a second layer comprising zinc oxide located over and contacting the layer comprising the oxide of NiCr;
another dielectric layer comprising silicon nitride located over the second layer comprising zinc oxide; and
wherein a dielectric layer stack between the glass substrate and the IR reflecting layer includes (a) said dielectric layer comprising titanium oxide having the refractive index of at least 2.0 which contacts the glass substrate, (b) said layer comprising silicon nitride, and c) said layer comprising zinc oxide which contacts the IR reflecting layer, wherein said dielectric layer comprising titanium oxide contacts said layer comprising silicon nitride in said layer stack between the glass substrate and the IR reflecting layer.

15. The coated article of claim 14, wherein the coating includes only one IR reflecting layer comprising silver.

* * * * *